US012598949B2

(12) United States Patent
Hanamachi et al.

(10) Patent No.: US 12,598,949 B2
(45) Date of Patent: Apr. 7, 2026

(54) STAGE AND METHOD OF MANUFACTURING STAGE

(71) Applicant: NHK SPRING CO., LTD., Yokohama (JP)

(72) Inventors: Toshihiko Hanamachi, Yokohama (JP);
Shuhei Morota, Yokohama (JP);
Masaru Takimoto, Yokohama (JP);
Yoshihito Araki, Yokohama (JP);
Hibiki Yokoyama, Yokohama (JP);
Masahiro Fujii, Yokohama (JP)

(73) Assignee: NHK SPRING CO., LTD., Yokohama (JP)

( * ) Notice: Subject to any disclaimer, the term of this patent is extended or adjusted under 35 U.S.C. 154(b) by 608 days.

(21) Appl. No.: 17/463,786

(22) Filed: Sep. 1, 2021

(65) Prior Publication Data

US 2021/0398839 A1 Dec. 23, 2021

Related U.S. Application Data

(63) Continuation of application No. PCT/JP2020/007433, filed on Feb. 25, 2020.

(30) Foreign Application Priority Data

Mar. 1, 2019 (JP) ................................. 2019-037589

(51) Int. Cl.
*H01L 21/683* (2006.01)
*C23C 4/12* (2016.01)
*H01J 37/32* (2006.01)

(52) U.S. Cl.
CPC ............ *H01L 21/6833* (2013.01); *C23C 4/12* (2013.01); *H01J 37/32715* (2013.01); *H01J 2237/334* (2013.01)

(58) Field of Classification Search
CPC ............. H01L 21/6833; H01L 21/6831; H01L 21/68757; H01L 21/68785;
(Continued)

(56) References Cited

U.S. PATENT DOCUMENTS 5,968,273 A 10/1999 Kadomura et al.
2002/0135969 A1 9/2002 Weldon et al.
(Continued)

FOREIGN PATENT DOCUMENTS

CN 103137534 A 6/2013
CN 108281342 A 7/2018
(Continued)

OTHER PUBLICATIONS

NPL1, Definition of alternately, Merriam-Webster; available Aug. 17, 2017; https://web.archive.org/web/20170817071749/https://www.merriam-webster.com/dictionary/alternately (Year: 2017).*
(Continued)

*Primary Examiner* — Michael A Gump
(74) *Attorney, Agent, or Firm* — Hauptman Ham, LLP

(57) ABSTRACT

A stage includes a base material having a first surface and a second surface adjacent to the first surface, and an insulating film including a plurality of particles, each of the plurality of particles having a flat surface. The flat surface included in the insulating film is provided along the first surface and the second surface. The base material includes a third surface in a direction 180 degrees opposite to the first surface, and a part of the flat surface included in the insulating film is provided along the third surface, and a surface obtained by extending the first surface and a surface obtained by extending the second surface intersect at 90 degrees. The base material includes a third surface in a direction 180 degrees
(Continued)

140

452 450 454 440

160

443
474
450
472
442-1
464
450
462 opposite to the first surface, and a part of the flat surface included in the insulating film is provided along the third surface.

8 Claims, 27 Drawing Sheets

(58) Field of Classification Search
CPC ........... H01L 21/67109; H01L 21/3065; H01L 21/683; C23C 4/12; C23C 4/11; C23C 4/134; C23C 4/06; C23C 4/129; C23C 24/04; C23C 16/4404; C23C 16/4585; H01J 37/32715; H01J 37/32807; H01J 2237/334; B23Q 3/15; H02N 13/00; B05D 1/04–10
USPC ............................ 269/289 R; 427/427.3, 453
See application file for complete search history.

(56) References Cited

U.S. PATENT DOCUMENTS

| | | | | |
|---|---|---|---|---|
| 2004/0190215 | A1 | 9/2004 | Weldon et al. | |
| 2005/0193951 | A1 | 9/2005 | Furuse et al. | |
| 2005/0199183 | A1 | 9/2005 | Arai et al. | |
| 2006/0097423 | A1* | 5/2006 | Aversenti | C23C 4/12 |
| | | | | 425/103 |
| 2006/0222777 | A1* | 10/2006 | Skoog | C23C 4/12 |
| | | | | 427/446 |
| 2007/0142956 | A1 | 6/2007 | Escher et al. | |
| 2008/0106842 | A1 | 5/2008 | Ito et al. | |
| 2008/0108225 | A1* | 5/2008 | Sun | C23C 16/4404 |
| | | | | 438/758 |
| 2013/0134147 | A1 | 5/2013 | Futakuchiya et al. | |
| 2013/0134148 | A1* | 5/2013 | Tachikawa | H01L 21/68785 |
| | | | | 219/444.1 |
| 2013/0273313 | A1 | 10/2013 | Sun et al. | |
| 2016/0076129 | A1 | 3/2016 | Nagayama et al. | |
| 2016/0211121 | A1* | 7/2016 | Sun | B32B 18/00 |
| 2017/0022595 | A1* | 1/2017 | Sato | C23C 4/18 |
| 2018/0190501 | A1* | 7/2018 | Ueda | H01J 37/32715 |
| 2019/0013230 | A1 | 1/2019 | Taga et al. | |
| 2019/0228953 | A1 | 7/2019 | Tachikawa et al. | |

FOREIGN PATENT DOCUMENTS

| | | | | |
|---|---|---|---|---|
| JP | H5-31239 | U | 4/1993 | |
| JP | H10-64983 | A | 3/1998 | |
| JP | 2600558 | Y2 | 10/1999 | |
| JP | 2001-335914 | A | 12/2001 | |
| JP | 2006-77944 | A | 3/2006 | |
| JP | 2008-117982 | A | 5/2008 | |
| JP | 2011-1612 | A | 1/2011 | |
| JP | 2014-13874 | A | 1/2014 | |
| JP | 2015-523458 | A | 8/2015 | |
| JP | 2015-193872 | A | 11/2015 | |
| JP | 2016-65302 | A | 4/2016 | |
| JP | 6027407 | B2 | 11/2016 | |
| JP | 2018-56333 | A | 4/2018 | |
| JP | 2019-16697 | A | 1/2019 | |
| JP | 2019-16704 | A | 1/2019 | |
| JP | 2019016697 | A * | 1/2019 | .......... H01J 37/3244 |

OTHER PUBLICATIONS

English translation of Written Opinion of the International Searching Authority mailed on Apr. 21, 2020, for the corresponding PCT application No. PCT/JP2020/007433.

Office Action issued on Aug. 1, 2023 for corresponding Japanese Patent Application No. 2021-503982, along with an English machine translation (4 pages).

Office Action issued on Jul. 28, 2023 for corresponding Korean Patent Application No. 10-2021-7026295, along with an English machine translation (13 pages).

Japanese Office Action issued on Jun. 21, 2022, in connection with the Japanese Patent Application No. 2021-503982.

International Search Report issued for corresponding International Patent Application No. PCT/JP2020/007433 on Apr. 21, 2020, along with an English translation.

Written Opinion issued for corresponding International Patent Application No. PCT/JP2020/007433 on Apr. 21, 2020.

Office Action issued for corresponding Taiwanese Patent Application No. 109106536 on Oct. 19, 2020, along with an English translation.

Office Action issued on May 25, 2023 for corresponding Chinese Patent Application No. 202080012364.5, along with an English machine translation (12 pages).

Office Action issued on Jan. 11, 2023, for corresponding Korean Patent Application No. 10-2021-7026295, along with an English machine translation (13 pages).

Office Action issued on Feb. 7, 2023 for corresponding Japanese Patent Application No. 2021-503982, along with an English machine translation (6 pages).

Extended European Search Report issued on Jul. 19, 2022, for corresponding European Patent Application No. 1 20766608.2.

Office Action issued on Feb. 22, 2024 for corresponding Korean Patent Application No. 10-2021-7026295, along with an English translation (7 pages).

Office Action issued on Feb. 29, 2024 for corresponding Chinese Patent Application No. 202080012364.5, along with an English machine translation (14 pages).

Office Action issued on Oct. 16, 2023 for corresponding Chinese Patent Application No. 202080012364.5, along with an English machine translation (14 pages).

Office Action issued on Apr. 29, 2024 for corresponding Chinese Patent Application No. 202080012364.5, along with an English machine translation (22 pages).

Notification of Submission of Information by third party, mailed on May 21, 2024, for corresponding Japanese Patent Application No. 2023-186800, along with English machine translations (5 pages).

Takeuchi et al., "Investigation of Electrical and Mechanical Characteristics of Al2O3 Sprayed Coatings", Articles of the Japanese Society of Mechanical Engineers, vol. 77, Issue 779, 2011, pp. 2932-2939, Cited in NPL No. 1, With English machine translation.

Shimizu, "Properties of Thermally Sprayed Coatings", Journal of The Surface Finishing Society of Japan, vol. 41, Issue 10, 1990, pp. 968-973, Cited in NPL No. 1, With English machine translation.

Nakagawa et al., "Reduction of Energy Consumption and Resources in Thermal Spray Process", Journal of The Surface Finishing Society of Japan, vol. 46, Issue 2, 1995, pp. 124-131, Cited in NPL No. 1, With English machine translation.

Notice of Allowance issued on Nov. 12, 2024 for corresponding Japanese Patent Application No. 2023-186800, along with an English machine translation (6 pages).

Office Action issued on Feb. 25, 2025, for corresponding Korean Patent Application No. 10-2024-7027832, along with an English machine translation (11 pages).

Notice of Reasons for Revocation dated Sep. 11, 2025, for corresponding Japanese Patent No. 7605941, along with an English machine translation (34 pages).

Japan Thermal Spray Society, "Thermal Spraying Engineering Handbook", 2017, Cited in NPL No. 1, With English machine translation (2 Pages).

Fukanuma, "Splat Morphology at Off-Normal Spray", Proceedings of the 69th National Symposium of Japan Thermal Spray Society, 1999, Cited in NPL No. 1, With English machine translation (5 Pages).

Notice of Dispatch of Duplicate of Written Opposition dated Jul. 17, 2025, with Written Opposition filed by a third party against Japanese Patent No. 7605941, along with an English machine translation (58 pages).

Office Action issued on Oct. 7, 2025 for corresponding Japanese Patent Application No. 2024-217651, along with an English machine translation (8 pages).

(56)        References Cited

OTHER PUBLICATIONS

Notice of Reasons of Revocation containing Written Opinion issued
on Feb. 5, 2026 for corresponding Japanese Patent No. 7605941,
along with an English machine Translation (62 pages).

* cited by examiner

122

140

140

STAGE AND METHOD OF MANUFACTURING STAGE

CROSS-REFERENCE TO RELATED APPLICATIONS

This application is a U.S. continuation application filed under 35 U.S.C. § 111(a), of International Application No. PCT/JP2020/007433, filed on Feb. 25, 2020, which claims priority to Japanese Patent Application No. 2019-037589, filed on Mar. 1, 2019, the disclosures of which are incorporated herein by reference.

FIELD

An embodiment of the present invention relates to a stage and a method of manufacturing the stage, for example, a stage for placing a substrate and a method of manufacturing the stage for placing the substrate.

BACKGROUND

Semiconductor devices are installed in almost all electronic devices and play an important role for the functions of the electronic devices. Semiconductor devices utilize semiconductor characteristics possessed by silicon, etc. Semiconductor devices are constructed by stacking a semiconductor film, an insulating film, and a conductive film on a substrate and patterning these films. These films are stacked by vapor deposition, sputtering, chemical vapor phase deposition (CVD), or substrate chemical reactions, and are patterned by a photolithography process. The photolithography process includes the formation of a resist on the films that are subjected to patterning, the exposure of the resist, the formation of a resist mask by development, the partial removal of these films by etching, and the removal of the resist mask.

The characteristics of the films described above depend largely on the conditions for forming the films or the conditions for patterning. One of the above conditions is a voltage applied to a mounting table (hereinafter referred to as stage) for installing a substrate. For example, the voltage applied to the stage included in an etching device has been increasing with the miniaturization of recent semiconductor devices, since the ratio of the diameter of a hole to be processed and the thickness of the film to be processed is increased. As the voltage applied to the stage increases, withstand voltages of members included in the stage need to be improved. The members included in the stage may be, for example, a cooling plate and an electrostatic chuck, or the like. For example, Japanese Patent No. 6027407 and Japanese Registered Utility Model No. 2600558 disclose a stage in which an insulating film is formed on the surface by using a thermal spraying method to improve the withstand voltage.

SUMMARY

One embodiment of the present invention is a stage. The stage includes a base material having a first surface and a second surface adjacent to the first surface, and an insulating film consisting of a plurality of particles each having a flat surface. A part of the flat surface included in the insulating film is provided along the first surface and the second surface.

In another embodiment, the base material includes a third surface in a direction 180 degrees opposite to the first surface, and a part of the flat surface included in the insulating film may be provided along the third surface.

In another embodiment, a surface obtained by extending the first surface and a surface obtained by extending the second surface may be provided to intersect at 90 degrees.

In another embodiment, a ratio of an area of a void to a predetermined area of the insulating film may be 5% or less.

In another embodiment, the base material may have a flow path through which a liquid flows.

In another embodiment, an electrostatic chuck may be provided on the insulating film.

One embodiment of the present invention is a method of manufacturing a stage, the method includes spraying an insulator onto a first surface from a perpendicular direction to the first surface while moving in a parallel direction to the first surface of the base material, and spraying the insulator onto a second surface from a perpendicular direction to the second surface while moving in a parallel direction to the second surface of the base material adjacent to the first surface.

In another embodiment, the method may include spraying the insulator onto a third surface from a perpendicular direction to the third surface while moving in a parallel direction to the third surface of the base material in a direction 180 degrees opposite to the first surface.

In another embodiment, a surface obtained by extending the first surface and a surface obtained by extending the second surface may be formed to intersect at 90 degrees.

In another embodiment, the spraying of the insulator onto the first surface and the spraying of the insulator onto the second surface may be continuously performed.

In another embodiment, the spraying of the insulator onto the first surface and the spraying of the insulator onto the second surface may be alternately repeated.

In another embodiment, the spraying of the insulator onto the third surface, the spraying of the insulator onto the second surface, and the spraying of the insulator onto the first surface may be continuously performed.

In another embodiment, the flat surface of some of the particles included in the insulating film may be sprayed so as to be provided along the first surface and the second surface.

In another embodiment, the flat surface of some of the particles included in the insulating film may be sprayed so as to be provided along the third surface.

DESCRIPTION OF EMBODIMENTS

Figure 1A:
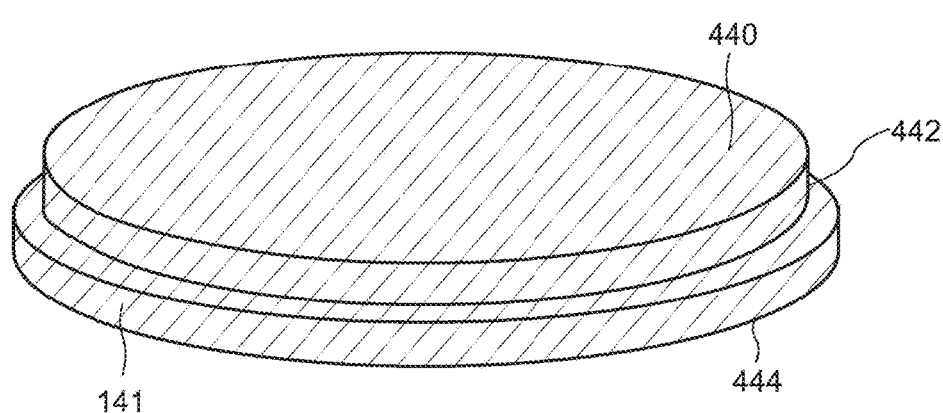
FIG. 1A is a perspective view showing a configuration of a stage according to an embodiment of the present invention.

Hereinafter, embodiments of the invention disclosed in the present application will be described with reference to the drawings. However, the present invention can be implemented in various forms without departing from the gist thereof and should not be construed as being limited to the description of the following exemplary embodiments.

For the sake of clarity of description, the drawings may be schematically represented with respect to widths, thicknesses, shapes, and the like of the respective portions compared with actual embodiments. However, they are merely an example and do not limit the interpretation of the present invention. In this specification and respective drawings, components having the same functions as those described with reference to the preceding drawings are denoted by the same reference numerals, and a duplicate description thereof may be omitted.

In the present invention, when a single film is processed to form a plurality of films, this plurality of films may have different functions and roles. However, this plurality of films is derived from films formed as the same layer in the same process and has the same layer structure and the same material. Therefore, the plurality of films is defined as existing in the same layer.

In this specification and the drawings, when multiple portions of one configuration are distinguished, for example, the same reference numerals are used, and a hyphen and a natural number are used.

In a conventional thermal spraying method, for example, a method of spraying an insulating film on a stage is changed for each surface of the stage. Therefore, gaps or voids have formed in the insulating film at an interface between the surfaces of the stage (hereinafter sometimes referred to as corner portion). Then, a withstand voltage of the sprayed insulating film decreased due to the gaps or voids. Therefore, in the stage, it is a challenge to improve the withstand voltage (hereinafter sometimes referred to as dielectric breakdown voltage) of the members contained in the stage to be sprayed by reducing the gaps or voids in the insulating film sprayed using the thermal spraying method.

It is one of purposes of an embodiment of the present invention to provide a stage having a high withstand voltage and a method of manufacturing the stage.

Some of the following embodiments illustrate stages having a high withstand voltage and methods of manufacturing the stages.

1. First Embodiment

In this embodiment, a stage 122 according to an embodiment of the present invention will be described.

1-1. Configuration of Stage

Figure 1B:
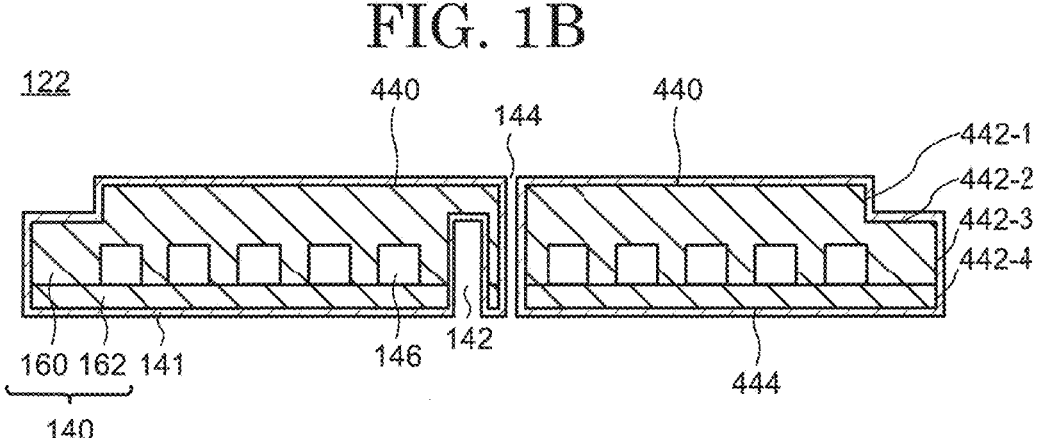
FIG. 1B is a cross-sectional view showing a configuration of a stage according to an embodiment of the present invention.
Figure 1C:
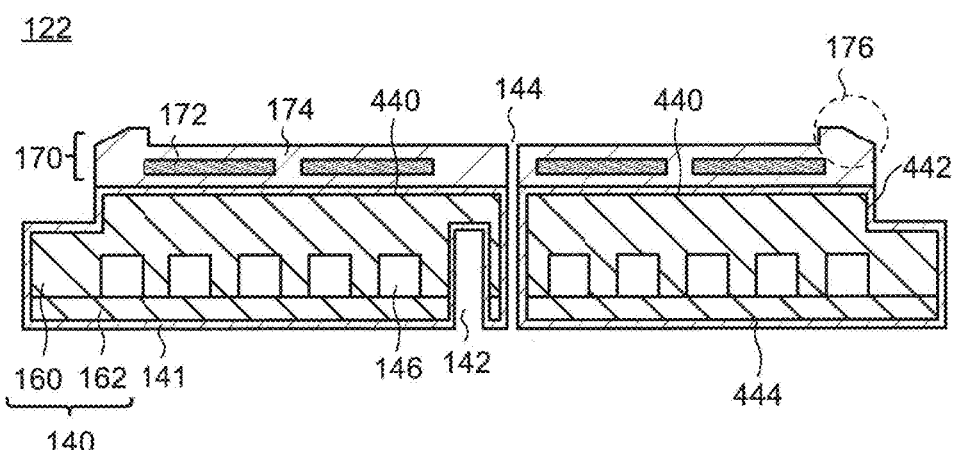
FIG. 1C is a cross-sectional view showing a configuration of a stage according to an embodiment of the present invention.

FIGS. 1A to 1C shows a cross-sectional view of the stage 122. As shown in FIGS. 1A and 1B, the stage 122 has a support plate 140 and a first insulating film 141.

The support plate 140 has at least a first surface 440, a second surface 442 adjacent to the first surface 440, and a third surface 444. The support plate 140 has a first base material 160 and a second base material 162. The first base material 160 has the first surface 440 and the second surface 442, and the second base material 162 has the third surface 444. The first insulating film 141 is provided on the first base material 160 and the second base material 162 by a thermal spraying method. That is, the first insulating film 141 is provided on the first surface 440, the second surface 442, and the third surface 444. The second surface 442 may include all of a portion of a second surface 442-1, a second surface 442-2, a second surface 442-3, and a second surface 442-4. In an embodiment of the present invention, although an example is shown in which the first insulating film 141 is provided on all of the third surface 444 is shown, the first insulating film 141 may be provided on a part of the third surface 444.

A surface obtained by extending the first surface 440 and a surface obtained by extending the second surface 442-1 are formed to intersect at 90 degrees or approximately 90 degrees to each other. A surface obtained by extending the second surface 442-1 and a surface obtained by extending the second surface 442-2 are formed to intersect at 90 degrees or approximately 90 degrees to each other. A surface obtained by extending the second surface 442-2 and a surface obtained by extending the second surface 442-3 are formed to intersect at 90 degrees or approximately 90 degrees to each other. A surface obtained by extending the second surface 442-3 and a surface obtained by extending the second surface 442-4 are formed to intersect at 90 degrees or approximately 90 degrees to each other. A surface obtained by extending the second surface 442-4 and a surface obtained by extending the third surface 444 are formed to intersect at 90 degrees or approximately 90 degrees to each other. The first surface 440 and the third surface 444 are formed in a direction 180 degrees or approximately 180 degrees opposite to each other.

The main material of the first base material 160 and the second base material 162 is metal or a ceramic, and for example, titanium (Ti), aluminum (Al), stainless steel, or an oxide containing these or the like can be used. The support plate 140 may be provided with an opening 142 to arrange a temperature sensor on a bottom surface. A thermocouple or the like can be used for the temperature sensor. In an embodiment, although and example is shown in which the first insulating film 141 is provided on the inner wall of the opening 142, the first insulating film 141 may be provided on a part of the inner wall of the opening 142.

A groove (flow path) 146 may be provided in the support plate 140 of the stage 122 for recirculating a medium for controlling the temperature of a substrate. A liquid medium such as water, an alcohol such as isopropanol or ethylene glycol, or silicone oil can be used as the medium. The groove 146 is formed in one or both of the first base material 160 and the second base material 162, and then the first base material 160 and the second base material 162 are joined by brazing or the like. The medium may be used in both cases when the stage 122 is cooled or heated.

Using a temperature controller 228 illustrated in FIG. 9, which will be described later, the temperature of the support plate 140 can be controlled by flowing a temperature-controlled medium through the groove 146.

Any known material can be used as the first insulating film 141 as long as it satisfies a desired withstand voltage and can be sprayed by the thermal spraying method. For example, one or more kinds of oxides of alkaline earth metal, rare earth metal, aluminum (Al), tantalum (Ta) and silicon (Si) are used as the material used for the first insulating film 141. Specific examples include aluminum oxide ($Al_2O_3$) and magnesium oxide (MgO), and the like.

The material used for the first insulating film 141 may include an inorganic insulator. Specific examples of the inorganic insulator include aluminum oxide, titanium oxide, chromium oxide, zirconium oxide, magnesium oxide, yttrium oxide, or a composite oxide thereof.

The thermal spraying method used in this specification and the like may be, for example, a Rokide thermal spraying method, a plasma spraying method, or a thermal spraying method in which these methods are combined.

Optionally, the stage 122 may have one or more through hole(s) 144 penetrating the support plate 140. A helium introduction tube may be provided in a chamber 202 illustrated in FIG. 9, which will be described later, so as to allow a highly thermally conductive gas, such as helium, to flow through the through hole 144. This allows the gas to flow through a gap between the stage 122 and the substrate and efficiently convey thermal energy of the stage 122 to the substrate. In an embodiment of the present invention, although an example is shown in which the first insulating film 141 is provided on the inner wall of the through hole 144, the first insulating film 141 may be provided on a part of the inner wall of the through hole 144.

As illustrated in FIG. 1C, the stage 122 may further include an electrostatic chuck 170 as a mechanism for securing the substrate onto the stage 122. The electrostatic chuck 170 may have a structure in which, for example, electrostatic chuck electrodes 172 are covered with an insulating film 174. By applying a high voltage (several hundred V to several thousand V) to the electrostatic chuck electrodes 172, it is possible to fix the substrate due to a Coulomb force between a charge generated in the electrostatic chuck electrodes 172 and a charge generated on the back surface of the substrate and having the opposite polarity to the charge generated in the electrostatic chuck electrodes 172. A ceramic such as aluminum oxide or aluminum nitride, and boron nitride can be used as the insulator. The insulating film 174 does not have to be completely insulated and may have some degree of conductivity (e.g., resistance ratio in the order of $10^9 \Omega cm$ to $10^{12}\ \Omega cm$). In this case, the above-described ceramic is doped with a metal oxide such as titanium oxide, zirconium oxide, or hafnium oxide to form the insulating film 174. A rib 176 may be provided around the electrostatic chuck 170 to determine the position of the substrate.

1-2. Manufacture of Stage

FIGS. 2A to 3C are cross-sectional views showing a first method of manufacturing the stage 122. Descriptions of the same or similar structures as those of FIG. 1A, FIG. 1B, or FIG. 10 may be omitted.

Figure 2A:
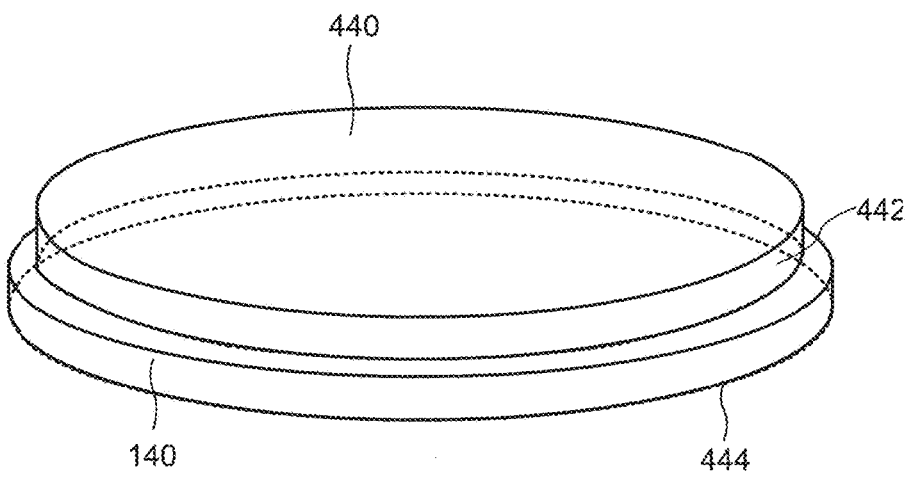
FIG. 2A is a perspective view showing a method of manufacturing a stage according to an embodiment of the present invention.

The first method of manufacturing the stage 122 will be described with reference to FIGS. 2A to 3C. First, as shown in FIG. 2A, the support plate 140 is prepared.

Figure 2B:
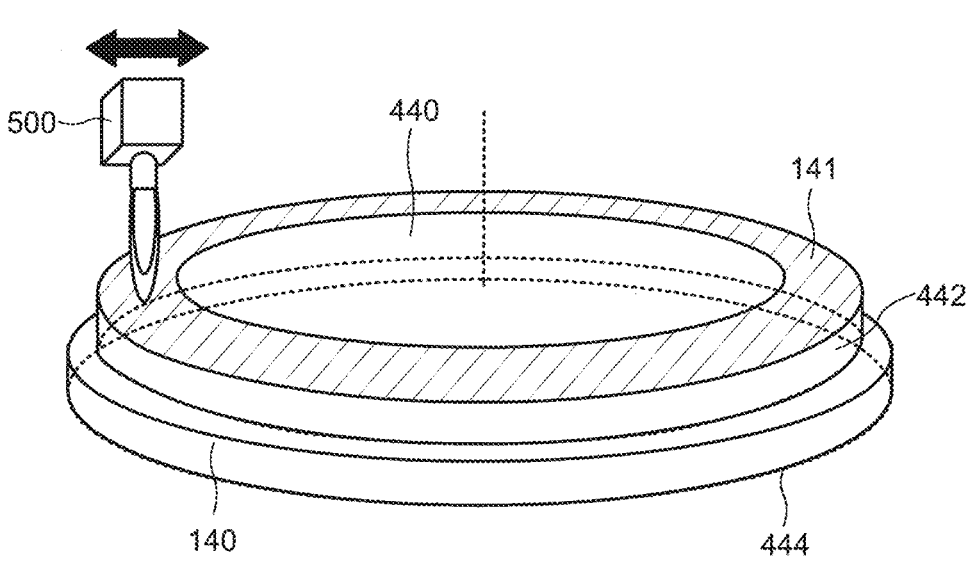
FIG. 2B is a perspective view showing a method of manufacturing a stage according to an embodiment of the present invention.

Next, as shown in FIG. 2B, the first insulating film 141 is formed on at least a part of the first surface 440 while moving a thermal sprayer 500 included in the thermal spraying device in a parallel direction to the first surface 440 of the support plate 140. At this time, the thermal sprayer 500 may repeatedly move from an end of the support plate 140 toward the approximate center of the first surface 440 of the support plate 140 and from the approximate center of the support plate 140 toward the end of the support plate 140 and the first insulating film 141 may be formed on at least a part of the first surface 440 while moving in a zigzag manner. Forming the first insulating film 141 on the first surface 440 using the thermal sprayer 500 included in the thermal spraying device may be referred to as forming the first insulating film 141 on the first surface 440 using the thermal spraying method. At this time, when the direction in which the particles sprayed from the thermal sprayer 500 are sprayed onto the first surface 440 is a thermal spraying direction, the thermal spraying direction and the first surface 440 may be substantially perpendicular or perpendicular. Movement of the thermal sprayer 500 in a parallel direction to the first surface 440 may be in one direction, or both one direction and 180 degrees in an opposite direction, as shown in FIG. 2B. By forming the first insulating film 141 on the first surface 440 while moving in both one direction and 180 degrees in an opposite direction, the first insulating film 141 can be uniformly formed on the first surface 440.

Figure 2C:
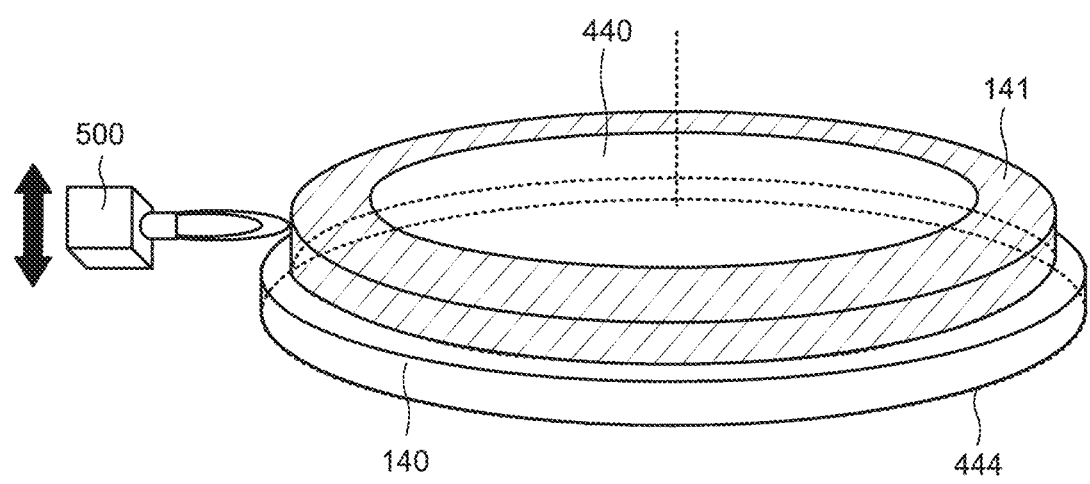
FIG. 2C is a perspective view showing a method of manufacturing a stage according to an embodiment of the present invention.

Next, as shown in FIG. 2C, the first insulating film 141 is formed on at least a part of the second surface 442 while moving the thermal sprayer 500 in a parallel direction to the second surface 442. At this time, the thermal sprayer 500 may repeatedly move from one end of the second surface 442 (e.g., the first surface 440 side) toward the other end of the second surface 442 (e.g., the third surface 444 side) and from the other end of the second surface 442 toward one end of the second surface 442, and the first insulating film 141 may be formed on at least a part of the second surface 442 while moving the thermal sprayer 500 in a zigzag manner. Forming the first insulating film 141 on the second surface 442 using the thermal sprayer 500 included in the thermal device may be referred to as forming the first insulating film 141 on the second surface 442 using the thermal spraying method. At this time, when the direction in which the particles sprayed from the thermal sprayer 500 are sprayed onto the second surface 442 is the thermal spraying direction, the thermal spraying direction and the second surface 442 may be substantially perpendicular or perpendicular. Movement of the thermal sprayer 500 in a parallel direction to the second surface 442 may be in one direction, or in both one direction and 180 degrees in an opposite direction, as shown in FIG. 2C. By forming the first insulating film 141 on the second surface 442 while moving the thermal sprayer 500 in both one direction and 180 degrees in an opposite direction, the first insulating film 141 can be uniformly formed on the second surface 442.

Figure 3A:
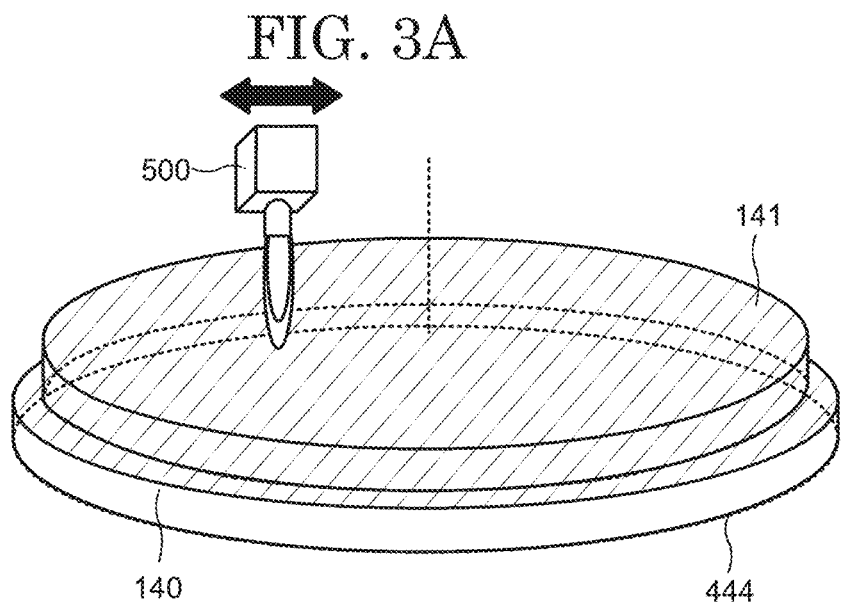
FIG. 3A is a perspective view showing a method of manufacturing a stage according to an embodiment of the present invention.
Figure 3B:
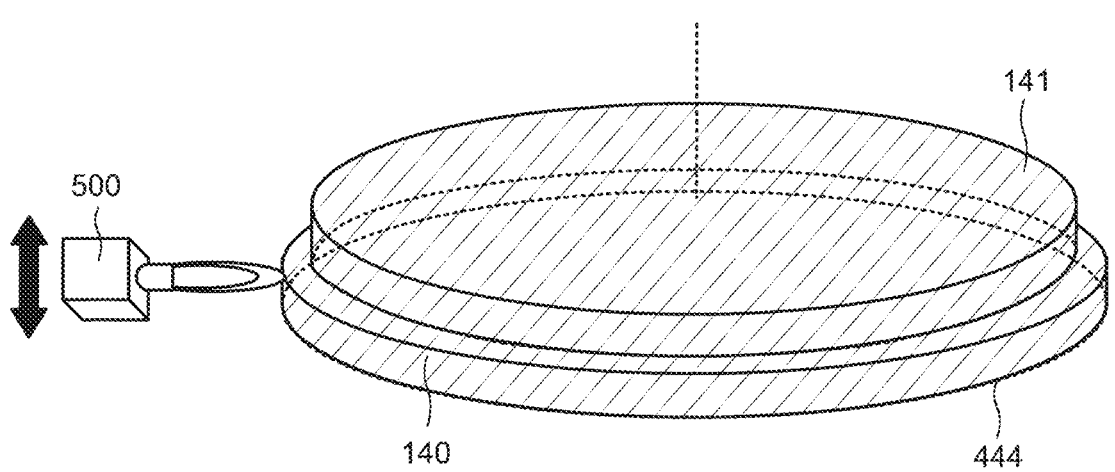
FIG. 3B is a perspective view showing a method of manufacturing a stage according to an embodiment of the present invention.

Next, similar to the method described in FIG. 2B, again, the first insulating film 141 is formed on the first surface 440 as shown in FIG. 3A. Subsequently, similar to the method described in FIG. 2C, again, the first insulating film 141 is formed on the second surface 442 as shown in FIG. 3B.

Figure 3C:
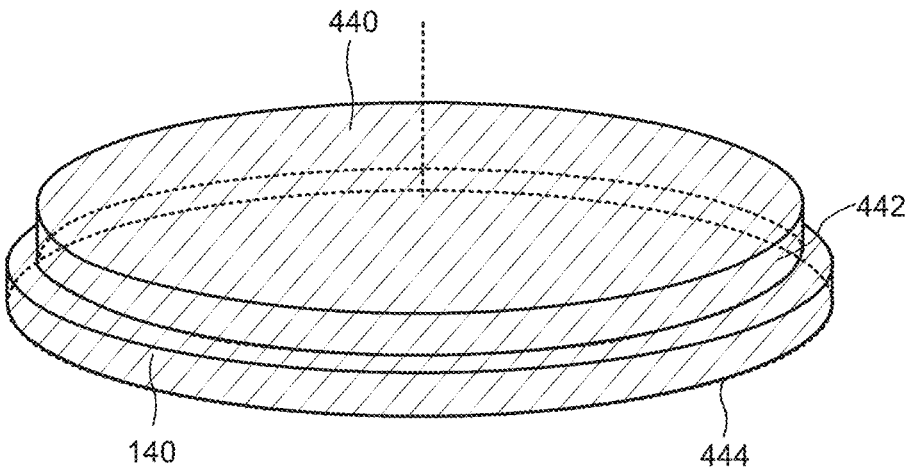
FIG. 3C is a perspective view showing a method of manufacturing a stage according to an embodiment of the present invention.

As described above, by forming the first insulating film 141 on each surface, the first insulating film 141 can be provided on the support plate 140 as shown in FIG. 3C. Further, for example, as shown in FIG. 10, the stage 122 can be manufactured by joining the support plate 140 and the electrostatic chuck 170. The support plate 140 and the electrostatic chuck 170 can be joined, for example, by welding, screwing, or brazing. The braze used in the brazing process includes an alloy containing silver, copper, and zinc, an alloy containing copper and zinc, copper containing trace amounts of phosphorus, aluminum, and alloys thereof, an alloy containing titanium, copper, and nickel, an alloy containing titanium, zirconium, and copper, and an alloy containing titanium, zirconium, copper, and nickel, and the like.

As described above with reference to FIGS. 2A, 2B, 2C, 3A, 3B, 3C, and 1A, by alternately repeating the formation of the first insulating film 141 on the first surface 440 and the formation of the first insulating film 141 on the second surface 442, the first insulating film 141 can be uniformly formed on the first surface 440 and the second surface 442 of the support plate 140. By alternately repeating the formation of the first insulating film 141 on the first surface 440 and the formation of the first insulating film 141 on the second surface 442, it is possible to suppress the generation of a gap or void in a corner portion between the first surface 440 and the second surface 442. The first insulating film 141 formed on the first surface 440 and the first insulating film 141 formed on the second surface 442 may overlap by alternately repeating the formation of the first insulating film 141 on the first surface 440 and the formation of the first insulating film 141 on the second surface 442. By overlapping the first insulating film 141 formed on the first surface 440 and the first insulating film 141 formed on the second surface 442, it is possible to suppress the generation of a gap or void in the corner portion between the first surface 440 and the second surface 442.

For example, the first insulating film 141 may be uniformly formed on a circular support plate 140 of approximately 30 cm by repeating formation of the first insulating film 141 on at least a part of the first surface 440 while moving the device sprayer 500 included in the thermal sprayer 1 mm in a parallel direction to the first surface 440 and the formation of the first insulating film 141 on at least a part of the second surface 442 while moving the thermal sprayer 500 included in the thermal sprayer 1 mm in a parallel direction to the second surface 442.

Optionally, the first insulating film 141 may be formed on at least a part of the third surface 444 while moving the thermal sprayer 500 in a parallel direction to the third surface 444. By repeatedly moving the thermal sprayer 500 from the end of the support plate 140 toward the approximate center of the third surface 444 of the support plate 140 and moving the thermal sprayer 500 from the approximate center of the support plate 140 toward the end of the support plate 140, the first insulating film 141 may be formed on at least a part of the third surface 444 while moving the thermal sprayer 500 in a zigzag manner. At this time, the first insulating film 141 may be uniformly formed on the first surface 440, the second surface 442, and the third surface 444 of the support plate 140 by repeatedly forming the first insulating film 141 on at least a part of the first surface 440, the first insulating film 141 on at least a part of the second surface 442, and the first insulating film 141 on at least a part of the third surface 444.

Figure 4A:
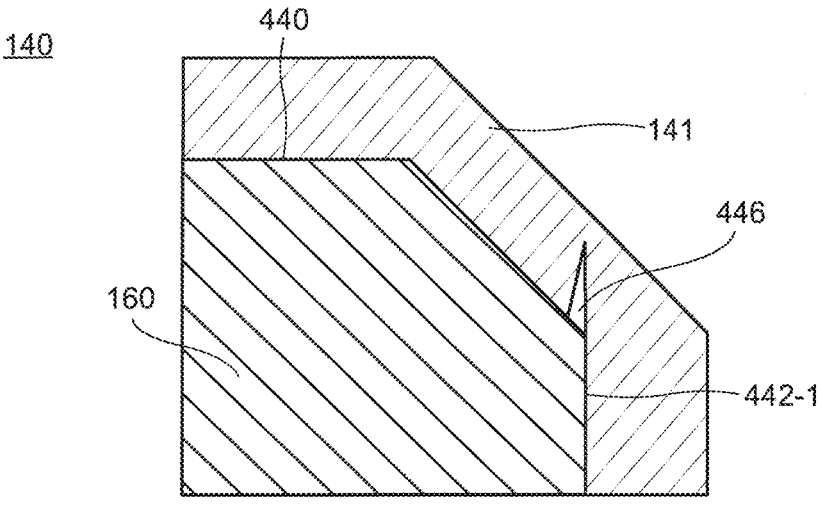
FIG. 4A is a cross-sectional view for explaining a part of a corner portion of a conventional stage.
Figure 4B:
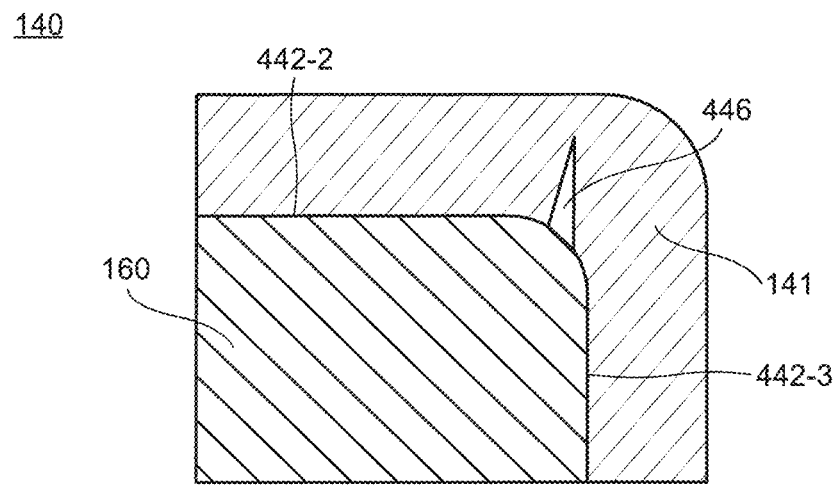
FIG. 4B is a cross-sectional view for explaining a part of a corner portion of a conventional stage.
Figure 4C:
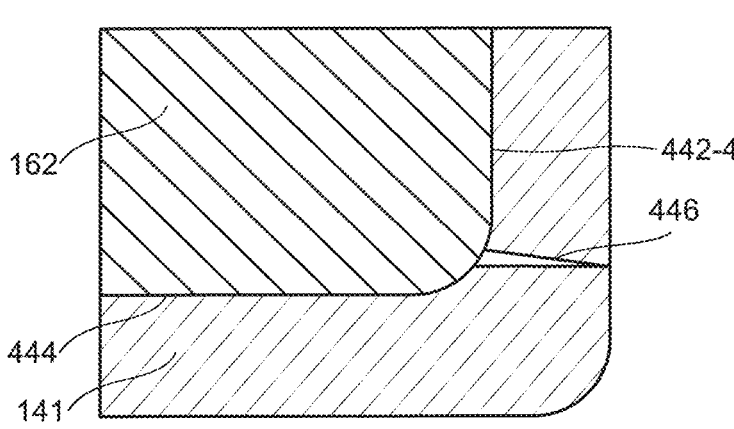
FIG. 4C is a cross-sectional view for explaining a part of a corner portion of a conventional stage.
Figure 5A:
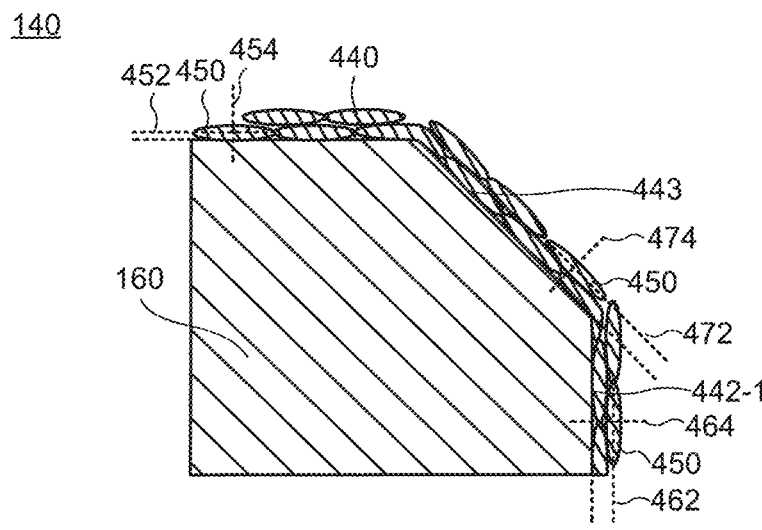
FIG. 5A is a cross-sectional view showing a part of a corner portion of a stage according to an embodiment of the present invention.

1-3. Comparison Between a Corner Portion of Support Plate of a Conventional Stage and a Corner Portion of Support Plate 140 of Stage 122 According to an Embodiment of the Present Invention FIGS. 4A to 4C is a cross-sectional view for explaining a part of a corner portion of the support plate of the conventional stage. FIGS. 5A to 6B are cross-sectional views showing a part of the corner portion of the support plate 140 of the stage 122 according to an embodiment of the present invention. FIG. 7 is an example of images obtained by capturing a part of the corner portion of the support plate 140 of the stage 122 according to an embodiment of the present invention. Description of the same or similar components as those of FIGS. 1A to 3C may be omitted. In the following explanation, the stage 122 having the configuration shown in FIG. 1B will be exemplified.

As shown in FIG. 4A, a corner portion between the first surface 440 and the second surface 442-1 has a C-chamfered shape. In FIG. 4B, as an example, a corner portion between the second surface 442-2 and the second surface 442-3 has a curvature. In FIG. 4C, as an example, a corner portion between the second surface 442-4 and the third surface 444 has a curvature. Conventionally, the first insulating film 141 formed on the corner portion between the first surface 440 and the second surface 442-1, the first insulating film 141 formed on the corner portion between the second surface 442-2 and the second surface 442-3, and the first insulating film 141 formed on the corner portion between the second surface 442-4 and the third surface 444 include large gaps or voids 446. The corner portion between the first surface 440 and the second surface 442-1 may have a curvature, the corner portion between the second surface 442-2 and the second surface 442-3 may have a C-chamfered shape, and the corner portion between the second surface 442-4 and the third surface 444 may have a C-chamfered shape.

Figure 5B:
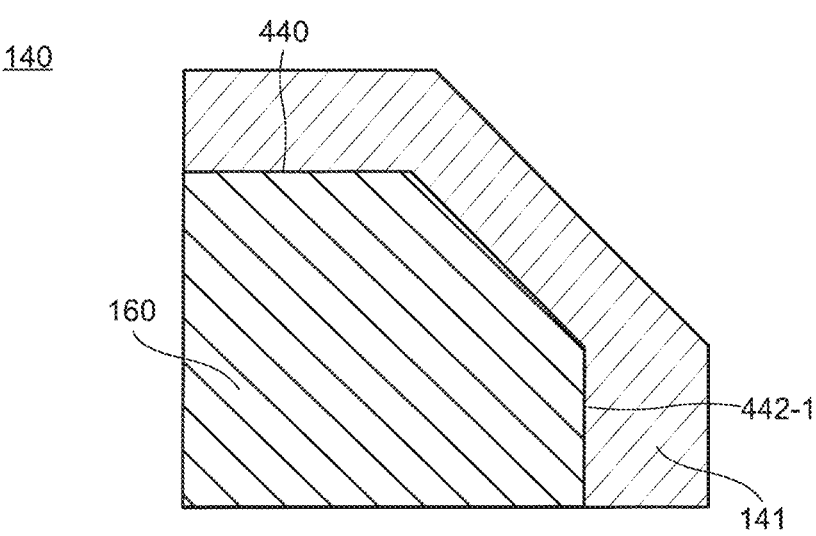
FIG. 5B is a cross-sectional view showing a part of a corner portion of a stage according to an embodiment of the present invention.
Figure 6A:
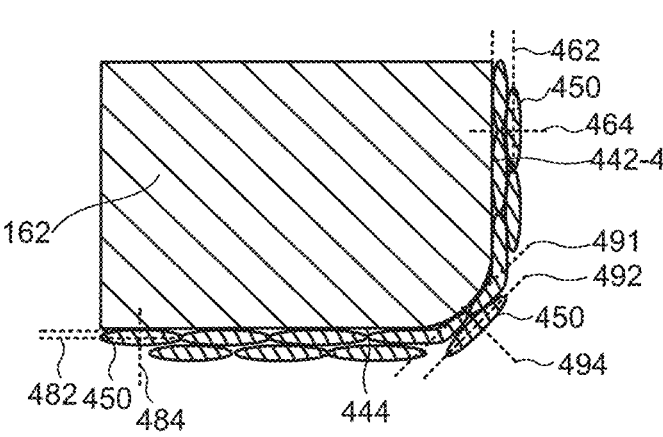
FIG. 6A is a cross-sectional view showing a part of a corner portion of a stage according to an embodiment of the present invention.

On the other hand, in FIG. 5B, the corner portion between the first surface 440 and the second surface 442-1 of the support plate 140 of the stage 122 has a C-chamfered shape. As shown in FIG. 5B, the first insulating film 141 formed on the corner portion between the first surface 440 and the second surface 442-1 does not include the large gaps or voids 446 and is a uniform film.

As shown in FIG. 5A, in the support plate 140 of the stage 122, the first insulating film 141 formed by the thermal spraying method is composed of a plurality of particles 450 having a flat shape on the first surface 440. A flat surface 452 of at least some of the particles 450 of the plurality of particles 450 is formed by the thermal spraying method along a surface parallel or substantially parallel to the first surface 440. Particles sprayed by the thermal sprayer 500 are the particles 450. A direction 454 perpendicular or substantially perpendicular to the flat surface 452 and a direction perpendicular or substantially perpendicular to the first surface 440 are parallel or substantially parallel to each other and are also parallel or substantially parallel to the thermal spraying direction in which the particles 450 sprayed by the thermal sprayer 500 are sprayed onto the first surface 440.

Similar to the first surface 440, on the second surface 442-1, the first insulating film 141 formed by the thermal spraying method is composed of the plurality of particles 450 having a flat shape, and a flat surface 462 of at least some of the particles 450 of the plurality of particles 450 is formed by the thermal spraying method along a surface parallel or substantially parallel to the second surface 442-1. Particles sprayed by the thermal sprayer 500 are the particles 450. Further, the direction 464 perpendicular or substantially perpendicular to the flat surface 462 and the direction perpendicular or substantially perpendicular to the second surface 442-1 are parallel or substantially parallel to each other and are also parallel or substantially parallel to the thermal spraying direction in which the particles 450 sprayed by the thermal sprayer 500 are sprayed onto the second surface 442-1.

Similar to the first surface 440 and the second surface 442-1, on a corner surface 443, the first insulating film 141 formed by the thermal spraying method is composed of the plurality of particles 450 having a flat shape, and a flat surface 472 of at least some of the particles 450 of the plurality of particles 450 is formed by the thermal spraying method along a surface parallel or substantially parallel to the corner surface 443. Particles sprayed by the thermal sprayer 500 are the particles 450. Further, a direction 474 perpendicular or substantially perpendicular to the flat surface 472 and a direction perpendicular or substantially perpendicular to the corner surface 443 are parallel or substantially parallel to each other and are also parallel or substantially parallel to the thermal spraying direction in which the particles 450 sprayed by the thermal sprayer 500 are sprayed onto the corner surface 443.

Figure 6B:
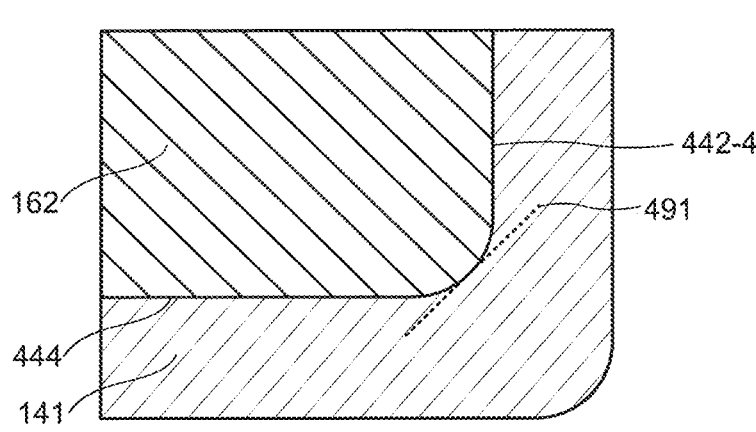
FIG. 6B is a cross-sectional view showing a part of a corner portion of a stage according to an embodiment of the present invention.
Figure 7:
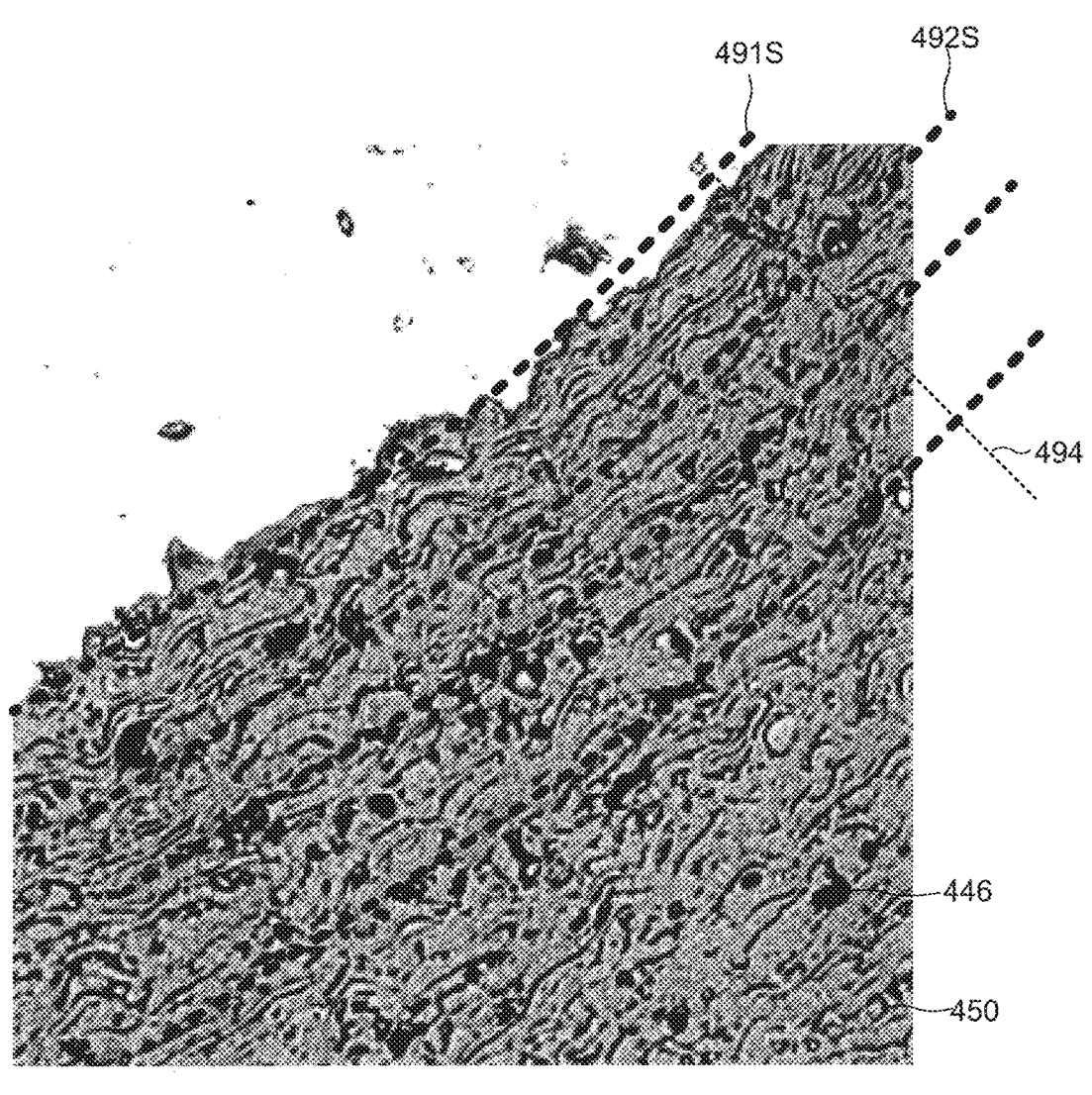
FIG. 7 is an example of images obtained by capturing a part of a corner portion of a stage according to an embodiment of the present invention with an electron microscope.

In FIG. 6B, the corner portion between the second surface 442-4 and the third surface 444 of the support plate 140 of the stage 122 has a curvature. As shown in FIG. 6B, the first insulating film 141 formed on the corner portion between the second surface 442-4 and the third surface 444 does not contain the large gaps or voids 446 and is a uniform film.

As shown in FIG. 6A, in the support plate 140 of the stage 122 according to an embodiment of the present invention, at the third surface 444 disposed in a direction 180 degrees opposite to the first surface 440, the first insulating film 141 formed by the thermal spraying method is composed of the plurality of particles 450 having a flat shape. A flat surface 482 of at least some of the particles 450 of the plurality of particles 450 is formed by the thermal spraying method parallel or substantially parallel to the third surface 444. Particles sprayed by the thermal sprayer 500 are the particles 450. A direction 484 perpendicular or substantially perpendicular to the flat surface 482 and the direction perpendicular or substantially perpendicular to the third surface 444 are parallel or substantially parallel to each other and are also parallel or substantially parallel to the thermal spraying direction in which the particles 450 sprayed by the thermal sprayer 500 are sprayed onto the third surface 444.

Similar to the third surface 444, in the second surface 442-4, the first insulating film 141 formed by the thermal spraying method is composed of the plurality of particles 450 having a flat shape. The configuration of the plurality of particles 450 formed on the second surface 442-4 is the same as the configuration of the plurality of particles 450 formed on the second surface 442-1 shown in FIG. 5A, and therefore the explanation thereof is omitted here.

Similar to the third surface 444 and the second surface 442-4, when one tangent surface with respect to each point constituting the corner portion between the third surface 444 and the second surface 442-4 is defined as a surface 491, also in the surface 491, the first insulating film 141 formed by the thermal spraying method is also composed of the plurality of particles 450 having a flat shape, and a flat surface 492 of at least some of the particles 450 of the plurality of particles 450 is formed by the thermal spraying method along a surface parallel or substantially parallel to the surface 491. Particles sprayed by the thermal sprayer 500 are the particles 450. Furthermore, the direction 494 perpendicular or substantially perpendicular to the flat surface 492 and the direction perpendicular or substantially perpendicular to the surface 491 are parallel or substantially parallel to each other and are also parallel or substantially parallel to the thermal spraying direction in which the particles 450 sprayed by the thermal sprayer 500 are sprayed onto the corner surface 491.

In FIG. 7, a curved surface 491S and a curved surface 492S formed by the plurality of particles 450 are shown by approximate guidelines (dot line). As shown in FIG. 7, in the curved surface 491S and the curved surface 492S, tangent surfaces at each point constituting the respective curved surfaces are parallel or substantially parallel to each other. That is, the direction 494 perpendicular or substantially perpendicular to the flat surface 492 and the direction perpendicular or substantially perpendicular to the tangent surfaces at each point constituting the respective curved surfaces are parallel or substantially parallel to each other and are also parallel or substantially parallel to the thermal spraying direction in which the particles 450 sprayed by the thermal sprayer 500 are sprayed onto the corner portion. In the stage according to an embodiment of the present invention illustrated in FIG. 7, an example that the size of the particles is about 25 μm is shown using aluminum oxide as the material of the first insulating film 141.

In the stage 122 according to an embodiment of the present invention, forming the first insulating film 141 from a perpendicular direction to the first surface 440 while moving the thermal sprayer 500 in a parallel direction to the first surface 440 of the support plate 140 by the thermal spraying method, and forming the first insulating film 141 from a perpendicular direction to the second surface 442 while moving the thermal sprayer 500 in a parallel direction to the second surface 442 adjacent to the first surface 440 by the thermal spraying method are alternately repeated. Thus, the flat surface of at least some of the particles 450 constituting the first insulating film 141 can be formed along a surface parallel or substantially parallel to the first surface 440 and the second surface 442.

The first insulating film 141 formed on the first surface 440 and the first 141 formed on the second surface 442 are formed to overlap each other. Consequently, the first insulating film 141 formed on the first surface 440, the second surface 442, and a corner portion of the first surface 440 and the second surface 442 becomes a uniform film substantially free of gaps or voids. Therefore, since the first insulating film 141 is densely formed on the support plate 140, a dielectric breakdown voltage of the support plate 140 is improved. Therefore, by applying the present invention to the stage and the method of manufacturing the stage, it is possible to provide the stage and the method of manufacturing the stage having a high withstand voltage.

2. Second Embodiment

In this embodiment, a second method of manufacturing the stage 122 according to an embodiment of the present invention will be described. Description of the same or similar configuration as that of the first embodiment may be omitted.

Figure 8A:
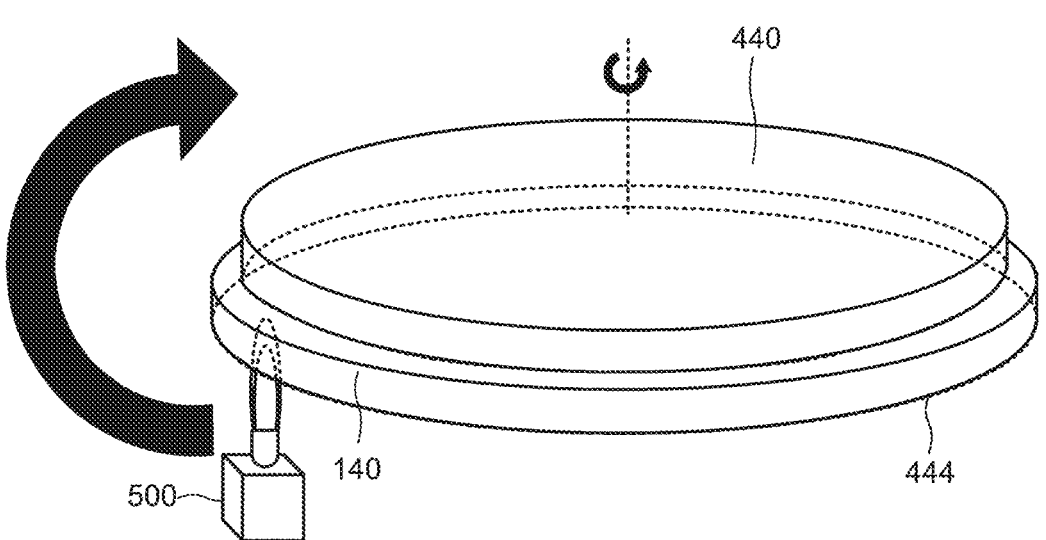
FIG. 8A is a perspective view showing a method of manufacturing a stage according to an embodiment of the present invention.
Figure 8B:
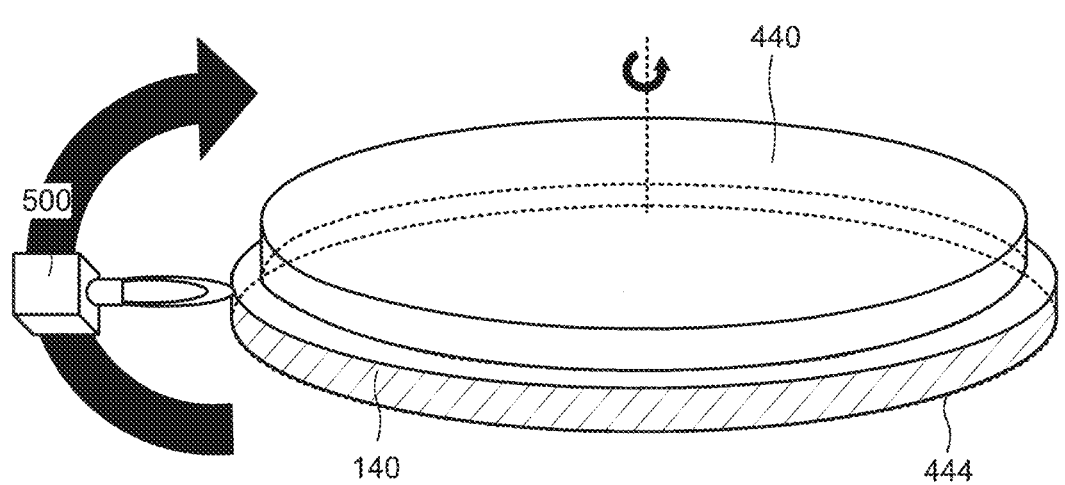
FIG. 8B is a perspective view showing a method of manufacturing a stage according to an embodiment of the present invention.
Figure 8C:
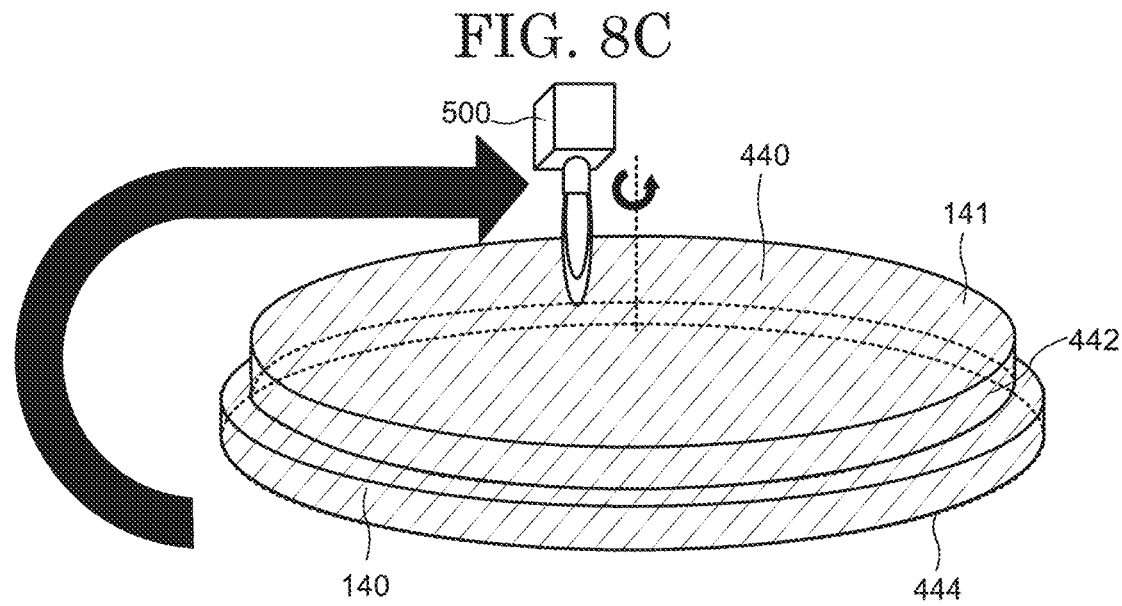
FIG. 8C is a perspective view showing a method of manufacturing a stage according to an embodiment of the present invention.

FIGS. 8A to 8C shows a second method of manufacturing the stage 122 according to an embodiment of the present invention. The second method of manufacturing the stage 122 is different from the first method of manufacturing the stage 122 shown in the first embodiment in that the formation of the first insulating film 141 on the third surface 444, the formation of the first insulating film 141 on the second surface 442, and the formation of the first insulating film 141 on the first surface 440 are performed while moving the thermal sprayer 500 continuously and in one direction. In the description of the second method of manufacturing the stage 122 below, the differences from the first manufacturing method will be mainly described.

First, since preparing the support plate 140 is the same as FIG. 2A shown in the first embodiment, a description thereof will be omitted.

Next, as shown in FIG. 8A, the support plate 140 is rotated about an axis substantially perpendicular to the approximate center of the first surface 440 of the support plate 140, and the first insulating film 141 is formed on at least a part of the third surface 444 while moving the thermal sprayer 500 included in the thermal spraying device in a parallel direction to the third surface 444.

Next, as shown in FIG. 8B, forming the first insulating film 141 on the second surface 442 using the thermal sprayer 500 is performed while moving the thermal sprayer 500 continuously and in one direction from a parallel direction to the third surface 444 along a parallel direction to the second surface 442. A method similar to the first method of manufacturing the stage 122 shown in the first embodiment can be used, for forming the first insulating film 141 on the second surface 442 using the thermal sprayer 500. The movement of the thermal sprayer 500 is continuous and unidirectional. Thus, by forming the first insulating film 141 from the third surface 444 to the second surface 442, the first insulating film 141 can be uniformly formed on the third surface 444 and the second surface 442.

Next, as shown in FIG. 8C, forming the first insulating film 141 on the first surface 440 using the thermal sprayer 500 is performed while moving the thermal sprayer 500 continuously and in one direction from a parallel direction to the second surface 442 along a parallel direction to the first surface 440. For forming the first insulating film 141 on the first surface 440 using the thermal sprayer 500, a method similar to the first method of manufacturing the stage 122 shown in the first embodiment can be used. The movement of the thermal sprayer 500 is continuous and unidirectional. Thus, by forming the first insulating film 141 from the second surface 442 to the first surface 440, the first insulating film 141 can be uniformly formed on the second surface 442 and the first surface 440.

As described above, by forming the first insulating film 141 on each surface, the first insulating film 141 can be provided on the support plate 140. Further, since joining the support plate 140 and the electrostatic chuck 170 is the same as that in FIG. 1A shown in the first embodiment, the explanation thereof is omitted here. As described above, the stage 122 can be manufactured by the second manufacturing method.

As described above with reference to FIGS. 2A, 8A, 8B, 8C, and 1A, by forming the first insulating film 141 on the third surface 444, forming the first insulating film 141 on the second surface 442, and forming the first insulating film 141 on the first surface 440 while moving the thermal sprayer 500 continuously and in one direction, the first insulating film 141 can be uniformly formed by the third surface 444, the second surface 442, and the first surface 440 of the support plate 140. It is further possible to suppress the generation of a gap or void in the corner portion between the third surface 444 and the second surface 442 and the corner portion between the second surface 442 and the first surface 440. Consequently, the first insulating film 141 formed on the third surface 444, the corner portion between the third surface 444 and the second surface 442, the second surface 442, the corner portion between the second surface 442 and the first surface 440, and the first surface 440 become a uniform film substantially free of gaps or voids. Therefore, since the first insulating film 141 is densely formed on the support plate 140, the dielectric breakdown voltage of the support plate 140 is further improved. Therefore, by applying the present invention to the stage and the method of manufacturing the stage, it is possible to provide a stage and a method of manufacturing the stage having a high withstand voltage.

The method of manufacturing the stage according to the present embodiment is not limited to the above-described manufacturing method.

The method of manufacturing the stage according to the present embodiment may be, for example, a manufacturing method of forming the first insulating film 141 on the first surface 440, forming the first insulating film 141 on the second surface 442, and forming the first insulating film 141 on the third surface 444, while moving the thermal sprayer 500 continuously and in one direction. In the manufacturing method of forming the first insulating film 141 on the first surface 440, forming the first insulating film 141 on the second surface 442, and forming the first insulating film 141 on the third surface 444 while moving the thermal sprayer 500 continuously and in one direction, the first insulating film 141 is formed densely on the support plate 140 similar to the manufacturing method described above. As a result, the dielectric breakdown voltage of the support plate 140 is further improved.

In the method of manufacturing the stage according to the present embodiment, for example, forming the first insulating film 141 on the third surface 444 may be a first thermal spraying and continuously forming the first insulating film 141 on the second surface 442 and forming the first insulating film 141 on the first surface 440 may be a second thermal spraying. Furthermore, in the method of manufacturing the stage according to the present embodiment, the first thermal spraying and the second thermal spraying may be alternately performed, the first thermal spraying and the second thermal spraying may be alternately repeated, the second thermal spraying and the first thermal spraying may be alternately performed, and the second thermal spraying and the first thermal spraying may be alternately repeated. By alternately repeating the first thermal spraying and the second thermal spraying, variations in the thickness of the insulating film of the stage are further suppressed. As a result, it is possible to provide a stage in which the insulating film is formed more uniformly.

In the method of manufacturing the stage according to the present embodiment, after performing the first thermal spraying and the second thermal spraying alternately, the first thermal spraying and the second thermal spraying may be performed continuously, and after repeating the first thermal spraying and the second thermal spraying alternately, the first thermal spraying and the second thermal spraying may be performed continuously and repeatedly. Similarly, in the case where the second thermal spraying is performed in advance, after performing the second thermal spraying and the first thermal spraying alternately, the first thermal spraying and the second thermal spraying may be performed continuously, and after repeating the second thermal spraying and the first thermal spraying alternately, the first thermal spraying and the second thermal spraying may be performed continuously and repeatedly. By performing the first thermal spraying and the second thermal spraying alternately and then performing the first thermal spraying and the second thermal spraying continuously, it is possible to further suppress variations in the thickness of the insulating film of the stage and further suppress the generation of a gap or a void in the corner portion of the stage.

3. Third Embodiment

In this embodiment, a film processing device provided with the stage 122 will be described as an example. Description of the same or similar configuration as that of the first embodiment or the second embodiment may be omitted.

Figure 9:
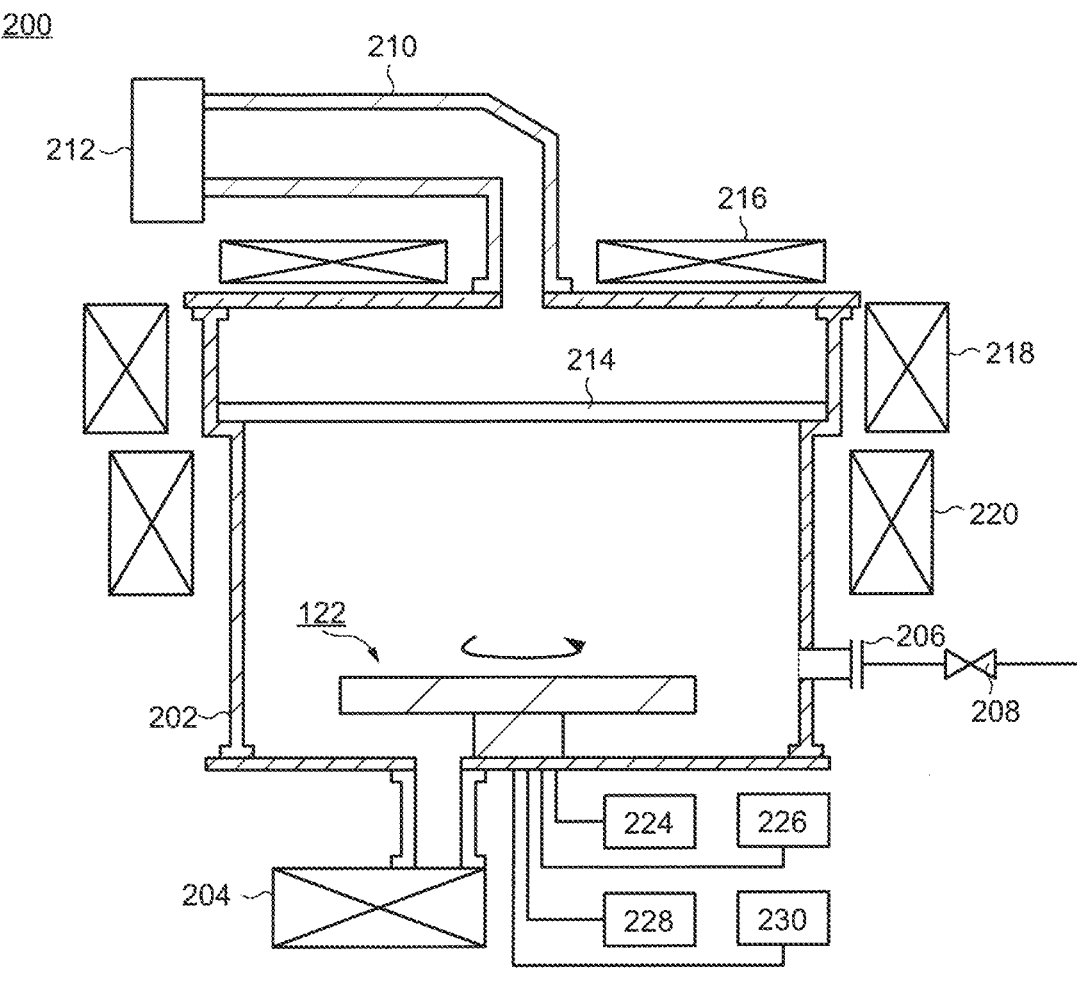
FIG. 9 is a schematic cross-sectional view of a film processing device including a stage according to an embodiment of the present invention.

In FIG. 9, a cross-sectional view of an etching device 200 which is one of the film processing devices is shown. The etching device 200 can perform dry etching on various films. The etching device 200 has the chamber 202. The chamber 202 provides a space for etching a film, such as a conductor, insulator, or semiconductor, formed on the substrate.

An exhaust device 204 is connected to the chamber 202, so that the inside of the chamber 202 can be set to a reduced-pressure atmosphere. The chamber 202 is further provided with an introduction tube 206 for introducing a reaction gas, and the reaction gas for etching is introduced into the chamber via a valve 208. Examples of the reaction gas include fluorine-containing organic compounds such as carbon tetrafluoride ($CF_4$), octafluorocyclobutane (c-$C_4F_8$), decafluorocyclopentane (c-$C_5F_{10}$), and hexafluorobutadiene ($C_4F_6$).

A microwave source 212 may be provided at the top of the chamber 202 via a waveguide 210. The microwave source 212 has an antenna for supplying microwaves, and outputs a high-frequency microwave such as a 2.45 GHz microwave and a 13.56 MHz radio wave (RF). The microwave generated by the microwave source 212 propagates by the waveguide 210 to the top of the chamber 202 and is introduced into the chamber 202 via a window 214 containing quartz or a ceramic, or the like. The reaction gas is converted into plasma by the microwave, and etching of the film proceeds by electrons, ions, and radicals contained in the plasma.

The stage 122 according to an embodiment of the present invention is provided in a lower portion of the chamber 202 in order to arrange a substrate. The substrate is arranged on the stage 122. A power supply 224 is connected to the stage 122, and a voltage corresponding to a high frequency power is applied to the stage 122, and an electric field produced by microwaves is formed on the surface of the stage 122 in a direction perpendicular to the substrate surface. A magnet 216, a magnet 218, and a magnet 220 can be further provided on the top and sides of the chamber 202. The magnet 216, the magnet 218, and the magnet 220 may be permanent magnets, or electromagnets having electromagnet coils. The magnet 216, the magnet 218, and the magnet 220 create magnetic field components parallel to the stage 122 and the surface of the substrate, and in conjunction with the electric field produced by microwaves, electrons in the plasma receive a Lorentz force and resonate and are bound to the stage 122 and the surface of the substrate. As a result, high-density plasmas can be generated on the surface of the substrate.

For example, a heater power supply 230 controlling the sheath heater is connected when the stage 122 is equipped with a sheath heater. The stage 122 may also be connected in any configuration to a power supply 226 for the electrostatic chuck for securing the substrate to the stage 122, the temperature controller 228 for controlling the temperature of the medium recirculated into the stage 122, and a rotating control device (not shown) for rotating the stage 122.

As described above, the stage 122 according to an embodiment of the present invention is used in the etching device 200. By using the stage 122, the substrate can be uniformly heated, and the heating temperature can be precisely controlled. By using the stage 122, it is possible to improve the dielectric breakdown voltage of the stage. By using the stage 122, the withstand voltage for the voltage applied to the substrate is improved. Therefore, by using the etching device 200, a contact having a high aspect ratio or a film having a high aspect ratio can be formed. Therefore, the etching device 200 enables uniform etching of the various films provided on the substrate.

4. Fourth Embodiment

This embodiment describes the percentage of the gaps or voids 446 in the corner portion of the stage according to an embodiment of the present invention, and the dielectric breakdown voltage of the stage according to an embodiment of the present invention. Description of the same or similar components as those of the first to third embodiments may be omitted.

Figure 10A:
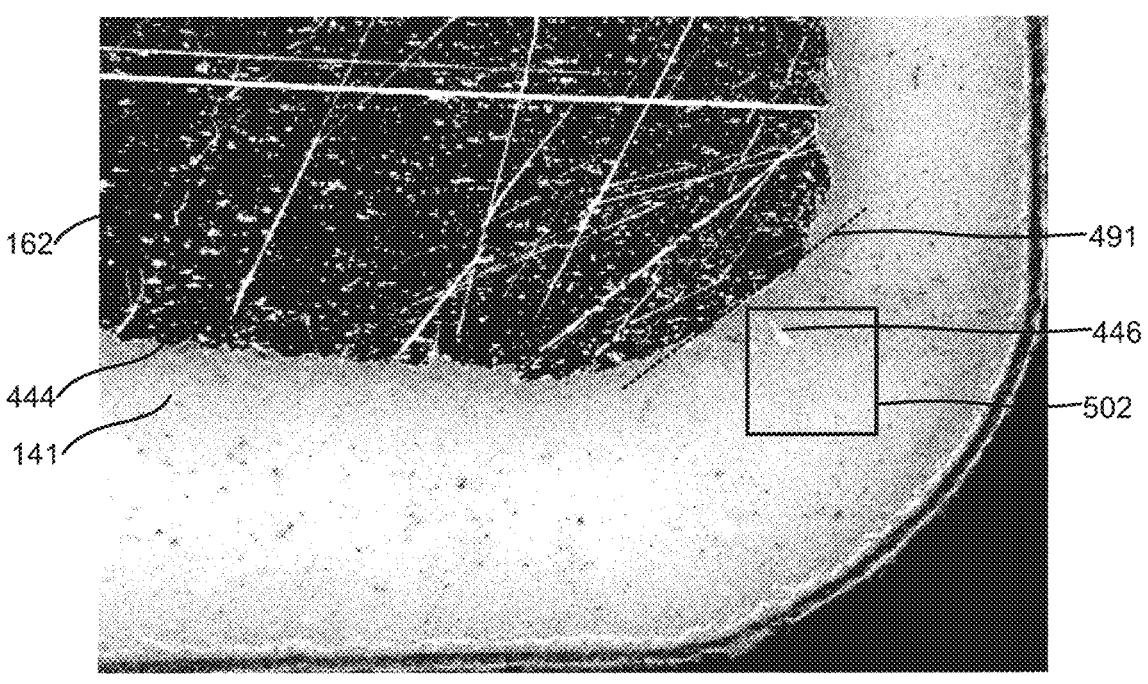
FIG. 10A is an example of images obtained by capturing a part of a corner portion of a stage according to an embodiment of the present invention with an electron microscope.
Figure 10B:
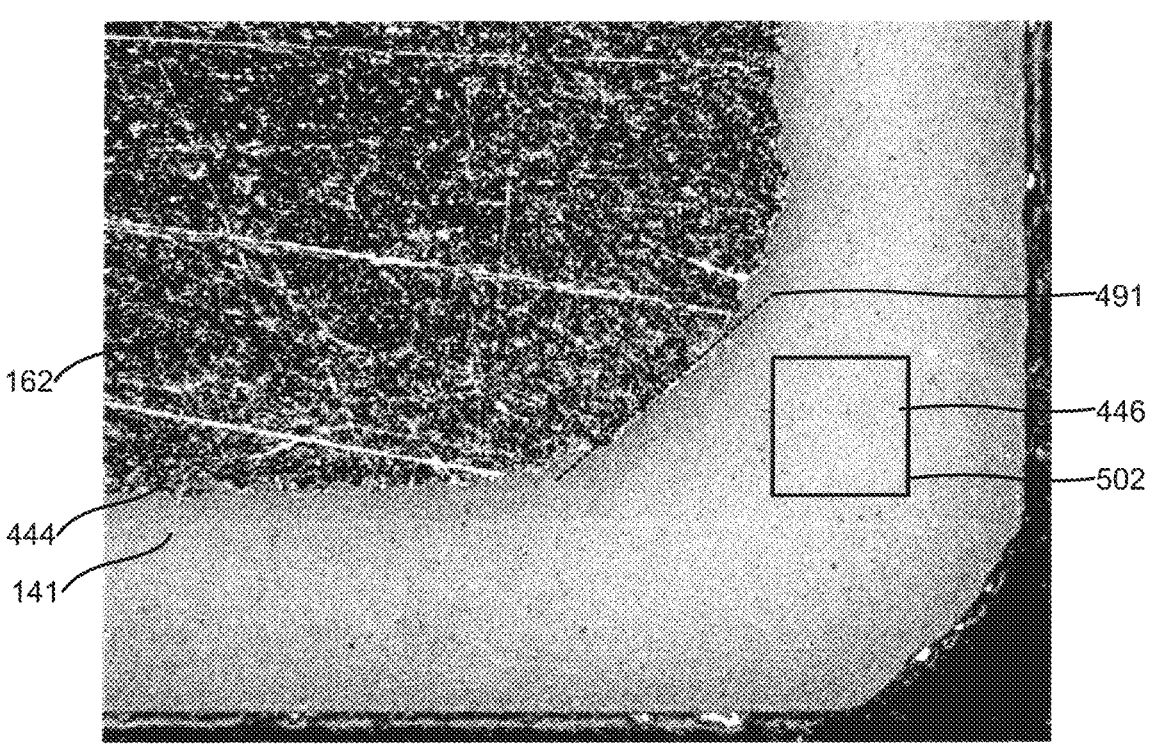
FIG. 10B is an example of images obtained by capturing a part of a corner portion of a stage according to an embodiment of the present invention with an electron microscope.

As shown in FIGS. 10A and 10B, the gaps or voids 446 are shown as black dots. In FIGS. 10A and 10B, there are no large gaps or voids 446 as there are in the corner portion in the conventional stage as shown in FIG. 4C. In FIG. 10A and FIG. 10B, a region 502 of 200 μm×200 μm is shown. In FIG. 10A, the ratio of the area of the gaps or voids 446 to the area of the region 502 is 4.33%. In FIG. 10B, the ratio of the area of the gaps or voids 446 to the area of the region 502 is 0.49%. That is, the ratio of the area of the gaps or voids 446 to the area of the region 502 of the corner portion formed by the first and second manufacturing methods is dramatically reduced compared to the conventional area ratio.

Figure 11:
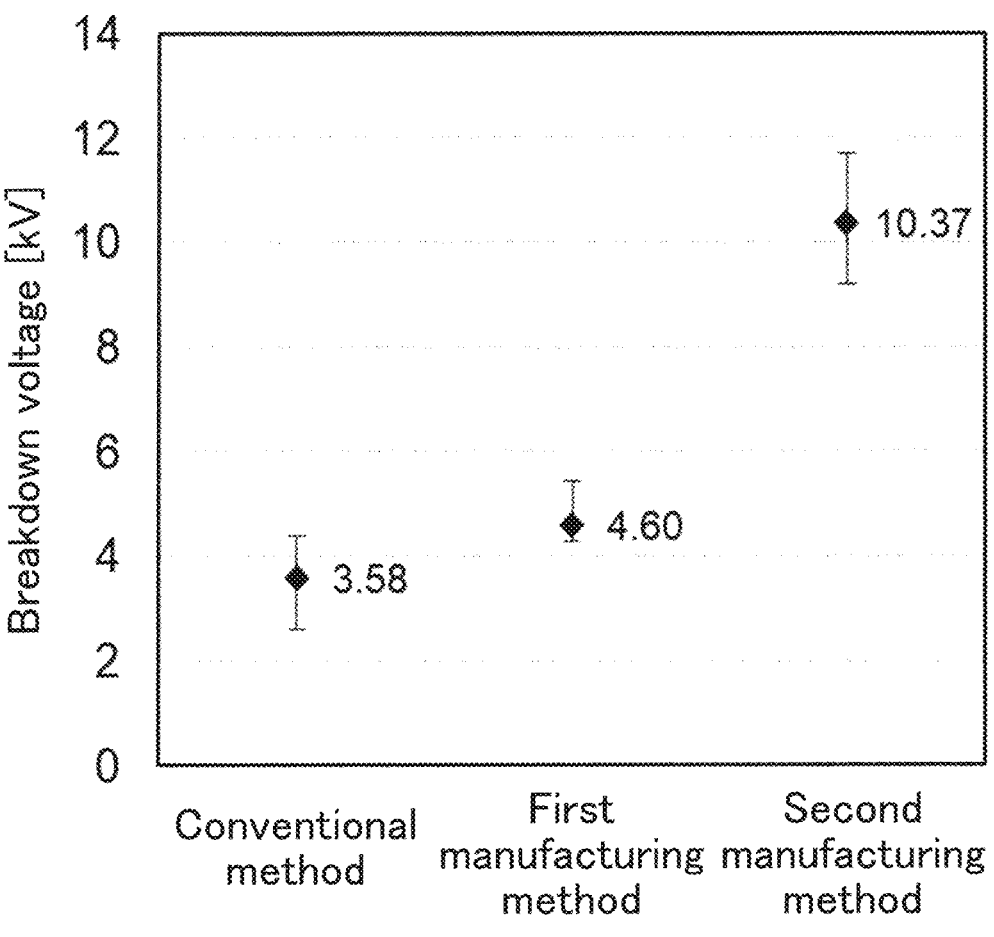
FIG. 11 is a diagram showing a dielectric breakdown voltage of a stage according to an embodiment of the present invention.

Next, as shown in FIG. 11, the dielectric breakdown voltage of the conventional stage was 3.58 kV, the dielectric breakdown voltage in the case where the stage according to an embodiment of the present invention was manufactured by the first manufacturing method was 4.60 kV, and the dielectric breakdown voltage in the case where the stage was manufactured by the second manufacturing method was 10.37 kV. The dielectric breakdown voltage in the case where the stage was manufactured by the first manufacturing method is 1 kV larger than the dielectric breakdown voltage in the conventional stage, and the dielectric breakdown voltage in the case where the stage was manufactured by the second manufacturing method is about three times larger than the dielectric breakdown voltage in the conventional stage.

5. Fifth Embodiment

In this embodiment, the stage 124 according to an embodiment of the present invention will be described. Description of the same or similar components as those of the first to fourth embodiments may be omitted.

Figure 12A:
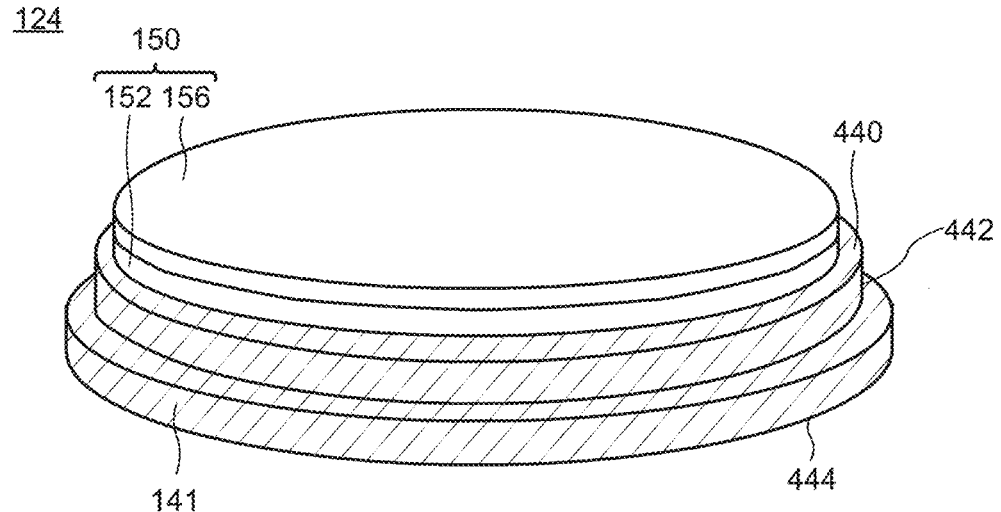
FIG. 12A is a perspective view showing a configuration of a stage according to an embodiment of the present invention.
Figure 12B:
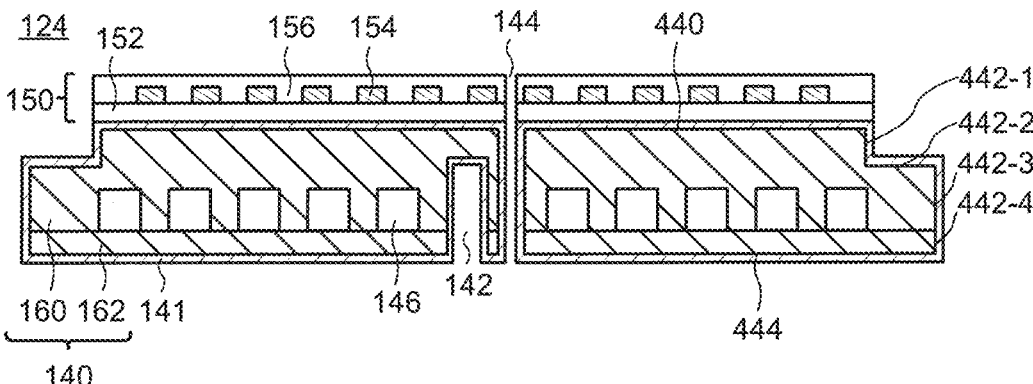
FIG. 12B is a cross-sectional view showing a configuration of a stage according to an embodiment of the present invention.
Figure 12C:
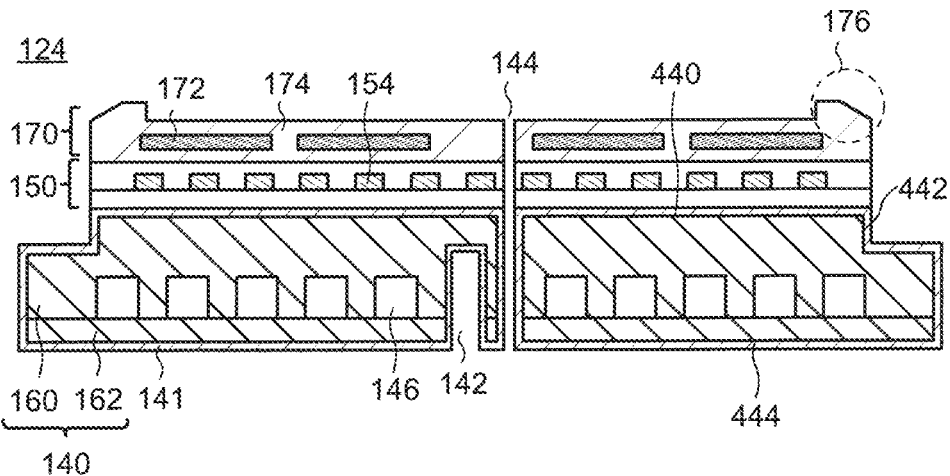
FIG. 12C is a cross-sectional view showing a configuration of a stage according to an embodiment of the present invention.

FIGS. 12A to 12C shows a perspective view or a cross-sectional view of a stage 124. The configuration of the stage 124 is different from that of the stage 122 shown in the first embodiment in that it has a configuration of a heater layer 150. In the following description of the configuration of the stage 124, mainly points different from the configuration of the stage 122 will be described. The first to fourth embodiments may be implemented by appropriately replacing the stage 122 described in the first to fourth embodiments with the stage 124 described in this embodiment.

As shown in FIG. 12A and FIG. 12B, the stage 124 has the support plate 140, and the heater layer 150 is provided there above.

At the stage 124, the temperature of the support plate 140 may be controlled by flowing the temperature-controlled medium through the groove 146 by the temperature controller 228 shown in FIG. 9 described above. However, the response of temperature control by a liquid medium is slow, and precise temperature control is relatively difficult. Therefore, it is preferable to roughly control the temperature of the support plate 140 using the medium and precisely control the temperature of the substrate using a heater wire 154 in the heater layer 150. This enables not only precise temperature control but also temperature adjustment of the stage 124 at high speed.

The heater layer 150 mainly has three layers. In particular, the heater layer 150 has a second insulating film 152, the heater line 154 on the second insulating film 152, and a third insulating film 156 on the heater wire 154 (FIG. 12B). Only one heater wire 154 may be provided in the heater layer 150, or a plurality of heater wires 154 may be provided, each of which may be independently controlled by the heater power supply 230 illustrated in FIG. 9. The heater wire 154 is electrically insulated by the second insulating film 152 and the third insulating film 156. Power supplied from the heater power supply 230 heats the heater wire 154, which controls the temperature of the stage 124.

The second insulating film 152 and the third insulating film 156 may include an inorganic insulator. Since the inorganic insulator is shown in the first embodiment, a description thereof is omitted here. The second insulating film 152 and the third insulating film 156 can be formed using the thermal spraying method. Since the thermal spraying method is shown in the first embodiment, the description thereof is omitted here.

The heater wire 154 may include a metal that generates heat by electric conduction. Specifically, the heater wire 154 may include a metal selected from tungsten, nickel, chromium, cobalt, and molybdenum. The metal may be an alloy containing these metals, for example an alloy of nickel and chromium, an alloy containing nickel, chromium, and cobalt.

The heater wire 154 is preferably formed by disposing a metal film formed by a sputtering method, an organometallic CVD (MOCVD) method, an evaporation method, a printing method, an electroplating method, or the like, or a metal foil processed separately by etching on the second insulating film 152. When forming the heater wire 154 using the thermal spraying method, it is difficult to ensure a uniform density, thickness, and width over the entire heater wire 154, whereas, in the case of the metal film or metal foil described above, it is possible to form the small heater wire 154 having small variations in these physical parameters. This makes it possible to precisely control the temperature of the stage 124 and reduce the temperature distribution.

Furthermore, since the alloy described above has a higher volume resistivity as compared with a metal alone, the layout of the heater wire 154, i.e., when the planar shape is the same, it is possible to increase the thickness of the heater wire 154 as compared with the case of using a metal alone. Therefore, it is possible to reduce the variation in the thickness of the heater wire 154, and it is possible to realize a smaller temperature distribution.

Optionally, the stage 124 may have one or more through hole(s) 144 that simultaneously penetrates the support plate 140 and the heater layer 150. A helium introduction tube may be provided in the chamber 202 shown in FIG. 9 to allow a gas with high thermal conductivity, such as helium, to flow through the through hole 144. This allows the gas to flow through the gap between the stage 124 and the substrate, and efficiently convey thermal energy of the stage 124 to the substrate. In an embodiment of the present invention, although an example is shown in which the first insulating film 141 is provided on the inner wall of the through hole 144, the first insulating film 141 may be provided on a part of the inner wall of the through hole 144.

As illustrated in FIG. 12C, the stage 124 may further have the electrostatic chuck 170 as a mechanism for securing the substrate on the stage 124. Since the electrostatic chuck 170 is shown in the first embodiment, a description thereof will be omitted.

As described above, the stage according to an embodiment of the present invention has fewer gaps or voids compared to the conventional stage and has a large dielectric breakdown voltage. Therefore, by applying the manufacturing method according to an embodiment of the present invention, a stage having a high withstand voltage and a method of manufacturing the stage can be provided.

Each of the embodiments described above as an embodiment of the present invention can be appropriately combined and implemented as long as they do not contradict each other. On the basis of each embodiment, those in which a person skilled in the art has appropriately added, deleted, or changed the design of the constituent elements are also included in the scope of the present invention as long as the gist of the present invention is provided.

It is understood that other operational effects different from those provided by the respective embodiments described above, or those which can be easily predicted by those skilled in the art, apparent from the description herein, are naturally brought about by the present invention.

What is claimed is:

1. A method of manufacturing a stage comprising:

spraying an insulator perpendicular to a front surface of a base material while moving parallel to the front surface, forming an insulating film including a first plurality of particles having flat surfaces parallel or approximately parallel to the front surface, spraying the insulator perpendicular to a corner surface while moving parallel to the corner surface, forming the insulating film including a second plurality of particles having flat surfaces parallel or approximately parallel to the corner surface, spraying the insulator perpendicular to a side surface of the base material while moving parallel to the side surface, and forming the insulating film including a third plurality of particles having flat surfaces parallel or approximately parallel to the side surface, wherein the corner surface is formed at a corner between the front surface and the side surface of the base material, at least one particle of the first plurality of particles has a surface which extends over and is in direct physical contact with the front surface and the corner surface to facilitate forming the insulating film, wherein the insulating film is continuous and uninterrupted over at least the front surface and the corner surface, and the spraying of the insulator on the front surface, the spraying of the insulator on the corner surface and the spraying of the insulator on the side surface are performed sequentially.

2. The method according to claim 1, further comprising spraying the insulator perpendicular to a back surface of the base material while moving parallel to the back surface, and forming the insulating film including a fourth plurality of particles having flat surfaces parallel or approximately parallel to the back surface, wherein the back surface is 180 degrees opposite to the front surface.

3. The method according to claim 2, wherein spraying of the insulator onto the back surface and continuously spraying of the insulator onto the side surface, the corner surface and the front surface are alternately repeated one after the other.

4. The method according to claim 3, wherein spraying of the insulator onto the back surface, spraying of the insulator onto the corner surface, spraying of the insulator onto the side surface and spraying of the insulator onto the front surface are continuously performed.

5. The method according to claim 2, wherein spraying of the insulator onto the back surface, and spraying of the insulator onto the side surface, the corner surface and the front surface are continuously performed.

6. The method according to claim 1, wherein the spraying of the insulator onto the front surface and the side surface are repeated one after the other.

7. The method according to claim 1, wherein the base material has a flow path through which a liquid flows.

8. The method according to claim 1, wherein an electrostatic chuck is provided on the base material.

* * * * *